United States Patent [19]

Brown

[11] Patent Number: 4,475,168

[45] Date of Patent: Oct. 2, 1984

[54] PERFORMANCE INDICATOR FOR COMPRESSOR ANALOGS

[75] Inventor: Morton E. Brown, San Antonio, Tex.

[73] Assignee: Southern Gas Association, Dallas, Tex.

[21] Appl. No.: 307,421

[22] Filed: Oct. 1, 1981

[51] Int. Cl.[3] ........................ G06G 7/48; G01R 25/00

[52] U.S. Cl. ................................ 364/803; 324/83 D; 364/481; 364/483

[58] Field of Search ............... 364/801, 802, 803, 821, 364/481, 483; 328/133; 324/83 R, 83 D, 123 R, 126, 142

[56] References Cited

U.S. PATENT DOCUMENTS

| | | | |
|---|---|---|---|
| 2,936,041 | 5/1960 | Sharp et al. | 181/206 |
| 2,951,638 | 9/1960 | Hughes et al. | 364/803 |
| 2,979,940 | 4/1961 | Damewood et al. | 73/659 |
| 2,997,124 | 8/1961 | Damewood et al. | 181/233 |
| 3,084,863 | 4/1963 | Du Vall | 324/142 |
| 3,486,499 | 12/1969 | Tsing Ton Yen | 324/123 R |
| 3,932,810 | 1/1976 | Kohler et al. | 324/126 |
| 4,011,503 | 3/1977 | Ferrara | 324/83 R |
| 4,237,423 | 12/1980 | Rhodes | 328/133 |
| 4,246,497 | 1/1981 | Lawson et al. | 324/83 D |
| 4,307,616 | 12/1981 | Vasile | 364/821 |
| 4,354,124 | 12/1982 | Shima et al. | 328/133 |
| 4,400,664 | 8/1983 | Moore | 328/133 |

*Primary Examiner*—Felix D. Gruber

*Attorney, Agent, or Firm*—Hubbard, Thurman, Turner & Tucker

[57] ABSTRACT

A self-contained measuring device indicates three parameters necessary to the determination of operating performance of an electrical analog of a reciprocating gas compressor or pump. A first portion of the device provides for measuring any horsepower changes during operation as a percentage of the ideal operating conditions. A second portion of the device measures the discharge current from the analog cylinder. A third portion of the device measures the phase between a sinusoidal reference signal and a non-sinusoidal periodic driving signal. The phase measuring portion of the device is used primarily for initial setup of the analog, while the first and second portions are used both during setup and during normal operation.

3 Claims, 6 Drawing Figures

PERFORMANCE INDICATOR FOR COMPRESSOR ANALOGS

BACKGROUND OF THE INVENTION

The present invention relates generally to electrical analogs of reciprocating compressors and pumps, and more specifically to monitoring devices to be used in conjunction with the operation of such analogs.

Installation or modification of natural gas or other fluid distribution systems requires consideration of a number of factors before work is undertaken. Variations in loads, distribution paths, pipe sizes and compressor speeds all have effects on the operation of the system as a whole. Compression waves created in the gas by the operation of reciprocating pumps and compressors are especially troublesome, as fluid acoustic resonances can be set up in the system. These resonances increase metal fatigue and shorten the life of joints, valves and other components of the system.

To assist in planning for control of pulsations and vibrations, an electrical analog of all fluid transfer components can be created. Present electrical systems analogize current to mass flow of the gas and voltage to pressure. Inductors, capacitors and resistors are used to model the acoustical and mechanical properties of pipes and other components in the distribution system. A detailed model of a distribution system or sub-system can be set up and studied to predict the effects caused by changing various parameters in the operation of the system. Examples of the use of gas pumping system analogs are found in U.S. Pat. Nos. 2,951,638 and 2,979,940.

In order to utilize easily obtained components, the operating frequency of the electrical analog is typically substantially higher than that of the mechanical system. An electrical to mechanical frequency ratio describes this relationship, which can be in the neighborhood of 1,000 to 1. Component values and analog system parameters are chosen so that all events which occur during the operation of the model reflect events which will take place in a mechanical system. For example, the presence of an electrical resonance in the analog system at a certain frequency corresponds to an acoustical resonance at the corresponding mechanical speed.

One model of a reciprocating compressor or pump includes a capacitor which is driven by a sinusoidal voltage source. Due to inaccuracies in the use of a fixed capacitor to model the changing volume of a compressor cylinder, the driving signal must be shaped to insure that the electrical model gives accurate results. The amount of phase shift introduced into the driving signal by the shaping circuit is generally not accurately determinable.

At present, the operations relating to the operating performance of an analog cylinder are made separately, and with much waste of effort. Changes in horsepower are made by taking a photograph of the pressure-volume diagram of the analog under ideal and under operating conditions, planimetering these photographs, and comparing the results of these two measurements. New photographs must be taken for each change in operating conditions of the overall system.

In order to accurately phase multicylinder compressor analogs, the phase of each cylinder relative to a reference signal must be properly adjusted. Such an adjustment requires accurate phase measurements of the voltages used to drive the analog cylinders. Since the driving signals have been arbitrarily shaped, the phase of the shaped signals cannot be detected by conventional phase meters. Also, the process of shaping the driving signals changes their phase, so that phase measurements of the unshaped driving signals does not give accurate results.

Due in part to the fact that change in horsepower measurements are not presently directly obtainable while the cylinder analog is in operation, a desired comparison of steady state current flow, corresponding to mass flow of gas, with changes in horsepower due to various operating conditions is not possible. Additionally, changes in pumped steady state current as a percentage of that obtained under ideal conditions is desirable.

It would be desirable to provide a device which accurately determines the phase relationship between a reference signal and a non-sinusoidal shaped driving signal. It would further be desirable that such a device can also be used to indicate percentage changes in cylinder horsepower and percentage changes in current flow during operation of the entire system. It would be desirable that all of these functions be incorporated into a single unit which it would be easy to use and which may be left permanently in place on a particular analog cylinder or be quickly detached and used to measure the operation of other analog cylinders.

SUMMARY OF THE INVENTION

It is therefore an object of the present invention to provide a device which easily and accurately determines percentage changes in horsepower, percentage changes in capacity and the relative phase of cylinder analogs of mechanical compressors.

According to the present invention, the phase of the non-sinusoidal shaped driving signals can be determined by a phase determining portion of the device. The phase of the non-sinusoidal driving signal is determined by inferring the peak of such a signal as being half-way between the positive and negative going transitions of the shaped signal past an arbitrary reference point. This inferred peak corresponds to the top dead center position of the mechanical piston. Since this top dead center point is 90° into the cycle, the phase of the shaped signal is adjusted until the phase difference between the sinusoidal reference signal and the shaped driving signal is 90°. The meter is then adjusted to read 90°, and will accurately track the true phase of the shaped driving signal as it is varied.

The percentage change in horsepower and capacity portions of the device are calibrated with the analog cylinder operating under ideal conditions, which are represented by the cylinder pumping into a large volume. The analog cylinder is then coupled into the remainder of the circuit, and continuous indications of changes in cylinder horsepower and capacity are indicated by the present invention.

The novel features which characterize the present invention are defined by the appended claims. The foregoing and other objects and advantages of the invention will hereinafter appear, and for purposes of illustration, but not of limitation, a preferred embodiment is shown in the accompanying drawings.

DESCRIPTION OF THE PREFERRRED EMBODIMENT

Figure 1:
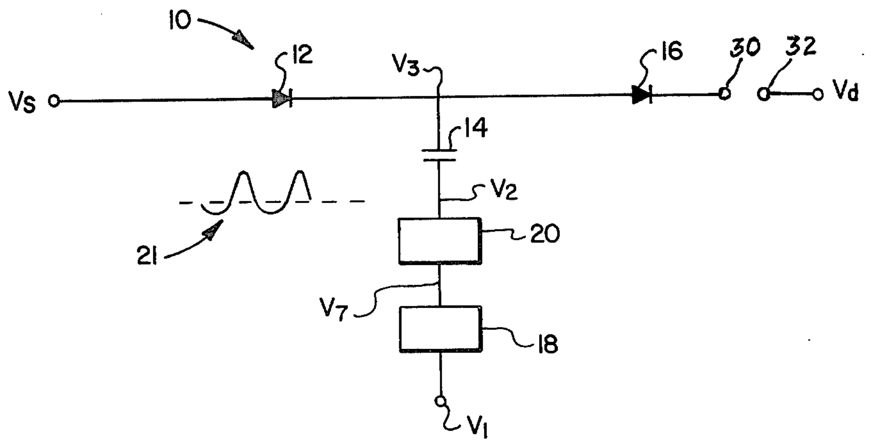
FIG. 1 is a model of a reciprocating gas compressor or pump.

Referring to FIG. 1, one model of a reciprocating gas compressor is indicated generally by the reference numeral 10. It is understood that the device of the present invention can be used with different models, and that the model of FIG. 1 is used only as an illustration. For an explanation of the manner in which models of this type correspond to a physical compressor, see U.S. Pat. No. 2,951,638.

An intake diode 12 models the action of an intake valve by allowing current to flow only from the intake piping into the cylinder of a compressor, which is modeled by a capacitor 14. A discharge diode 16 models a discharge valve of the compressor by allowing current to flow only from the capacitor 14 to the discharge piping. Static pressure in the suction piping is modeled by a fixed voltage $V_s$, while $V_d$ models the static discharge pressure.

The mechanical driving force into the crankshaft is simulated by a sinusoidal driving signal voltage $V_1$. The analog 10 models only the operation of a single cylinder of a compressor, while most compressors have a plurality of cylinders. It will be appreciated by those skilled in the art that a plurality of these models can be operated simultaneously to model the operation of a multi-cylinder compressor. It will be further appreciated that the voltage $V_1$, which models the power input to the crankshaft of the compressor, can be used to drive all of the analog cylinders in the model.

In a multi-cylinder compressor, each cylinder operates at a different phase from the others. This phase is fixed by the location of the attachment of the connecting rod for each cylinder to the crankshaft. To accurately model the operation of a multi-cylinder compressor, it is therefore necessary that the phase of the driving signal to each cylinder 10 be variable with respect to the common driving signal $V_1$. Therefore, an adjustable phase shifting circuit 18 is included in the single cylinder model 10, and has a phase-shifted sinusoidal output $V_7$.

The capacitor 14 models the action of the cylinder itself. Because the capacitor 14 has a fixed value, and the cylinder volume is constantly changing, inaccuracies are introduced into the model 10. To compensate for these inaccuracies, it is necessary to change the shape of the driving signal waveform somewhat. This is accomplished in a shaping circuit 20. The voltage $V_2$ out of the shaping circuit 20 has a shape shown as 21, which can be approximately described as a sinusoidal signal having enlarged positive lobes.

The analog 10 is a charge pump which transfers charge from a lower to a higher voltage. When both diodes 12 and 16 are non-conducting, the voltage across the capacitor 14 remains fixed. Since voltage $V_2$ is varying, voltage $V_3$, which corresponds to the pressure of gas in the mechanical cylinder, also varies.

When $V_3$ is between $V_s$ and $V_d$, both diodes 12, 16 are in the off state, and $V_3$ tracks the changing driving signal $V_2$. When $V_2$ falls low enough to bring $V_3$ slightly below the static suction voltage $V_s$, intake diode 12 turns on, and current charges the capacitor 14. The cylinder pressure voltage $V_3$ cannot fall below $V_s$ by more than the turn-on voltage of intake diode 12, so that the capacitor 14 charges until $V_2$ reaches its minimum value. When the shaped driving signal $V_2$ increases, $V_3$ increases above $V_s$ and turns the intake diode 12 off. $V_3$ increases until it becomes slightly larger than $V_d$, which causes the discharge diode 16 to turn on. $V_3$ cannot rise above this value, so the capacitor 14 discharges through the diode 16 as $V_2$ increases. When $V_2$ begins to fall, $V_3$ drops below $V_d$ and discharge diode 16 turns off. $V_3$ continues to drop with $V_2$ until it reaches $V_s$, at which point the intake diode 12 turns on and the cycle repeats.

The wave shaping circuit 20 introduces an unpredictable phase shift into the shaped driving signal $V_2$. As indicated above, it is important that the relative phases of shaped driving signals into the various cylinders be set at an accurately determined value. The phase shift between the various analog cylinders should be the same as that between the real life cylinders, and for the model to function properly it is necessary that these phase shifts be set accurately.

Figure 2:
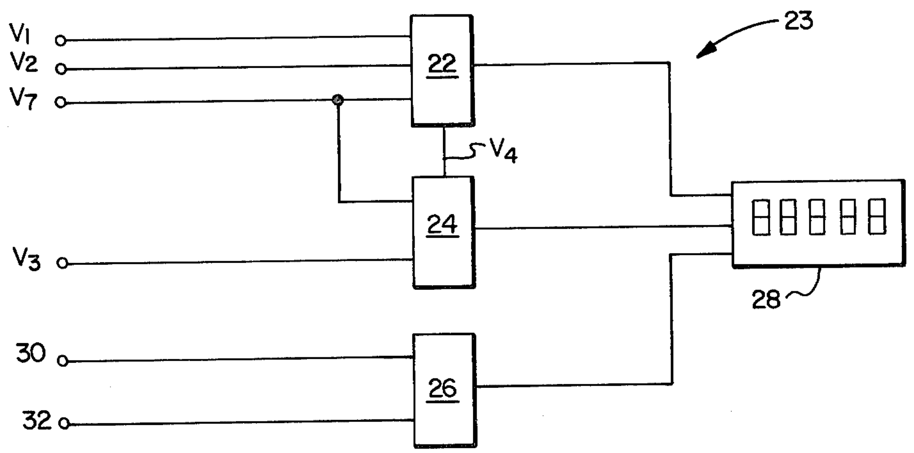
FIG. 2 is a block diagram of a performance indicator according to the present invention.

Referring to FIG. 2, a block diagram of the preferred embodiment of the present invention is shown. This apparatus includes portions for measuring phase 22, relative horsepower 24, and steady-state current (gas) flow 26. The output of each portion is switchably coupled to a digital output device 28. Alternatively, a separate meter can be coupled to the output of each portion, if reading of more than one result simultaneously is desired.

Voltages $V_3$ and $V_7$ are coupled to the horsepower indicator 24 and voltages $V_1$, $V_2$ and $V_7$ are coupled to the phase indicator 22 as shown. Additionally, $V_4$ is coupled from the horsepower indicator 24 to the phase indicator 22 as discussed in connection with FIGS. 3 and 5. Connections 30 and 32 are coupled into the flow meter 26 as described in connection with FIG. 4.

Figure 3:
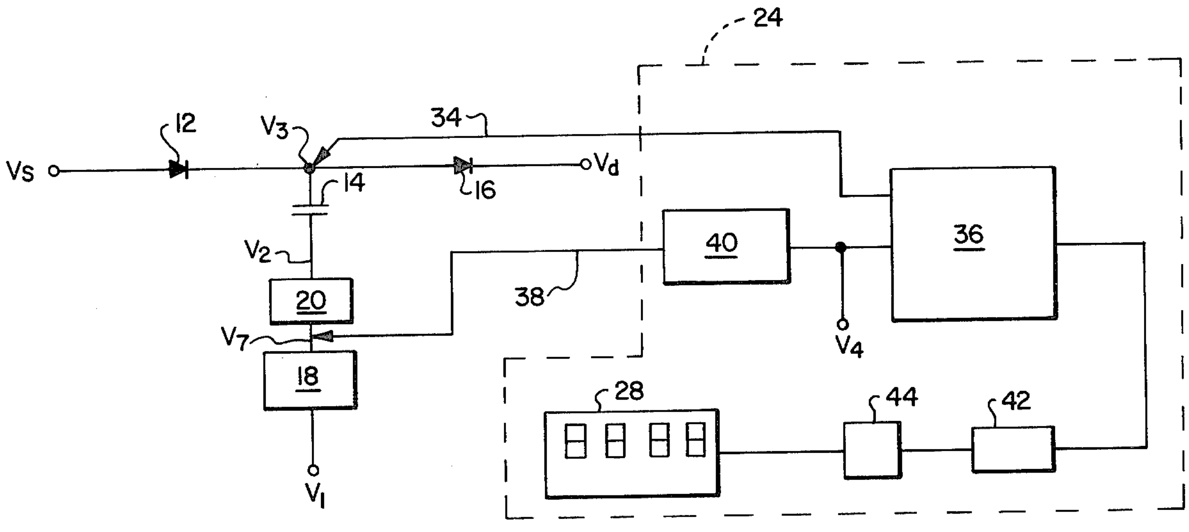
FIG. 3 is a schematic diagram of a portion of the device of FIG. 2 for indicating relative changes in horsepower.

That portion of the device for measuring the relative changes in analog cylinder horsepower 24 is shown in FIG. 3. For purposes of using this device, it is not necessary to compute the absolute cylinder horsepower. Instead, the apparatus 24 measures only changes in the horsepower level. The apparatus 24 is calibrated with the compressor 10 running under an ideal load, and the horsepower output relative to this ideal is determined when the compressor 10 is used in a complete system.

Cylinder horsepower can be calculated from the following equation:

$$Hp = K \int p\, d\mathrm{Vol} \quad (1)$$

Where Hp is horsepower, K is a constant relating horsepower to work, p is cylinder pressure and Vol is cylinder volume. Since the object of the horsepower indicator 24 is to indicate relative changes in horsepower, the constant is not necessary and we need only look at the integrand of equation (1). Cylinder pressure in the mechanical system is modeled by voltage $V_3$ in the electrical system, and an equation for mechanical volume Vol as a function of angular crankshaft position $\theta$ is:

$$Vol=Vol(m)-Vol(s)\cos\theta \quad (2)$$

Where Vol(m) is the cylinder volume with the piston in the center of its travel, and Vol(s) is ½ the total volume swept by the face of the piston. $\theta$ is zero when the piston has reached its midpoint of travel on the upstroke. By differentiation:

$$dVol=Vol(s)\sin\theta d\theta \quad (3)$$

Since the horsepower indicator 24 measures only proportional changes and not absolute values, the constant Vol(s) is ignored. Since the analog driving signal $V_7$ is represented by cos $\theta$, sin $\theta$ (or dVol) is obtained by phase shifting the unshaped driving signal $V_7$ by 90°.

A preferred embodiment of the relative horsepower indicator 24 is shown in FIG. 3. A first test lead 34 is coupled to the capacitor 14 to measure voltage $V_3$. The other end of this lead 34 is coupled to a first input of a multiplier 36. A second test lead 38 is coupled to the output of the phase-shifting circuit 18 to measure voltage $V_7$, and the other end of the second lead 38 is connected to a phase shifter 40. The phase shifter 40 shifts the driving signal $V_7$ through an angle of +90°. The output voltage $V_4$ from the phase shifter 40 is coupled to a second multiplier input. The output of the multiplier 36 is the product of the cylinder voltage $V_3$ and the shifted driving signal voltage $V_4$. In the preferred embodiment, the multiplier 36 is a precision analog multiplier.

The voltage output level of the multiplier 36 is adjusted in a calibration device 42, the output of which, in turn, is coupled to an integrator 44. The calibrator 42 is preferably a voltage amplifier having an adjustable gain. The integrator output is coupled to the meter 28, which preferably utilizes a digital display.

With the analog cylinder pumping into the analog of a large volume, calibrator 42 is adjusted so that meter 28 reads 100% (or 1.00). Relative horsepower changes are thereafter indicated as percentages of ideal operating conditions on the meter 28 when the analog cylinder 10 is coupled into the complete analog system.

Figure 4:
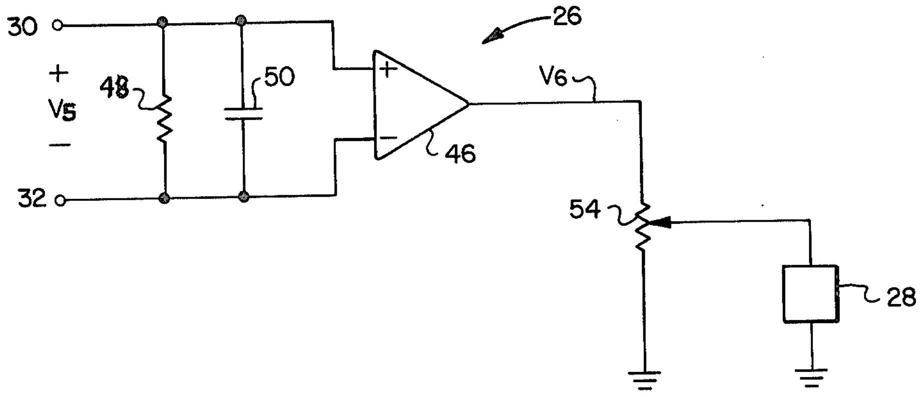
FIG. 4 is a portion of the device of FIG. 2 for indicating relative changes in steady state analog current flow.

A preferred current flow detector 26 is shown in FIG. 4. Terminals 30 and 32 are connected in series with either the input or output of the pump analog 10. Preferably, the output line from the pump analog 10 is opened near the cathode of the discharge diode 16, and terminals 30 and 32 connected to the cut ends. Since terminal 30 is connected to the positive input of a differential amplifier 46, terminal 30 should be connected to the cut end nearest the discharge diode 16 cathode.

Resistor 48 is therefore in series with the discharge current from the pump analog 10. Resistor 48 has a small value, so that the voltage drop across it is negligible. Capacitor 50 has large value. It is coupled in parallel to resistor 48 so that pulsations are shorted around the resistor 48. Only the steady state current flows through the resistor 48, and causes a small voltage $V_5$ to appear thereon.

The small voltage $V_5$ appearing across the resistor 48 is amplified in the differential amplifier 46, giving an output voltage $V_6$ proportional to the current flow through the resistor 48. Meter 52 measures a voltage proportional to $V_6$ as determined by potentiometer 54. During calibration (analog cylinder pumping into a large volume), resistor 54 is adjusted so that meter 28 reads 100 (or 1.00). Changes in flow will thereafter register as percentage changes.

Figure 5:
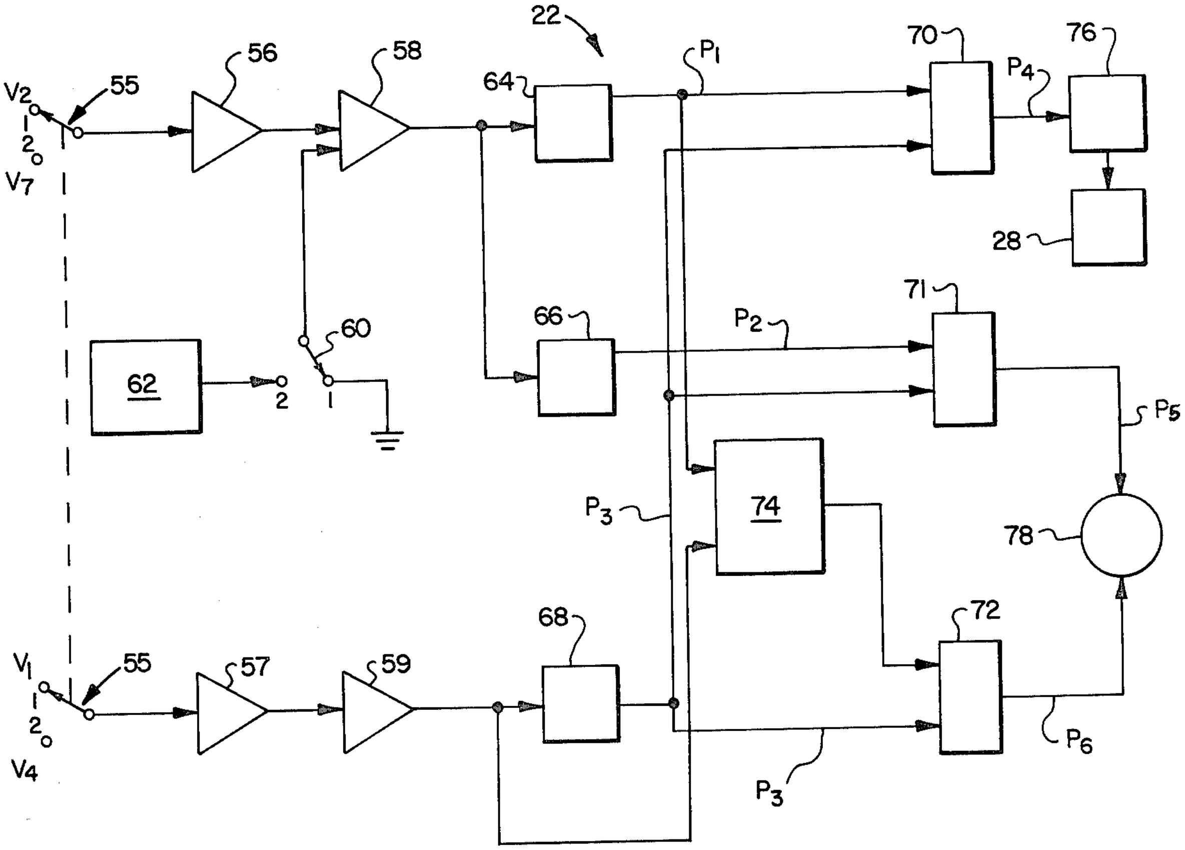
FIG. 5 is a portion of the device of FIG. 2 for measuring the relative phases of a sinusoidal reference signal and a non-sinusoidal driving signal.

Referring to FIG. 5, a preferred portion for measuring the relative phases of the sinusoidal driving signal $V_1$ and the shaped signal $V_2$ is designated generally as 22. The shaped driving signal $V_2$ is coupled to the input of a first high impedance buffer 56 through one side of a double pole-double throw switch 55, which serves to isolate the phase detector 22 from the operation of the compressor analog 10. The reference driving signal $V_1$ is coupled to a second isolation buffer 57 through the other side of the switch 55. The output from the first buffer 56 is coupled to one input of a first voltage comparator 58. The second input of the voltage comparator 58 is coupled to a switch 60, which connects the second input to a calibration circuit 62, or to ground. The calibration circuit 62 is used to adjust the voltage level into the second input of the comparator 58. The output of the first comparator 58 is a square wave which changes value when the shaped driving signal $V_2$ changes sign. A second voltage comparator 59 is coupled to the output of the second isolation buffer 57, and generates a square wave which changes value each time the reference driving signal $V_1$ changes between a positive and a negative value.

First and second pulse generators 64,66 are coupled to the output of the first comparator 58. The first generator 64 creates a first pulse train output $P_1$ consisting of a narrow pulse at each positive going transition of the square wave output of the first comparator 58. The second generator 66 creates a second pulse train output $P_2$ consisting of a narrow positive pulse at each negative going transition of the square wave output of the first comparator 58. A third pulse generator 68 is coupled to the output of the second comparator 59 and generates a third pulse train output $P_3$ consisting of a narrow pulse at each positive going transition of the output of the second comparator 59.

The outputs of the pulse generators 64,66,68 are coupled to the inputs of three flip-flops 70, 71, 72. The flip-flops can be, for example, S-R flip-flops or J-K flip-flops. In the preferred embodiment, S-R flip-flops are used, and the output from the first pulse generator 70 is coupled to the S input of the first flip-flop 70, and the output of the third pulse generator is coupled to the R input. The S input of the second flip-flop 71 is coupled to the output of the third pulse generator 68, and the R input is coupled to the output of the second pulse generator 66. The outputs of the first pulse generator 64 and the second comparator 59 are combined in a logic control circuit 74, the output of which is coupled to the S input of the third flip-flop 72. The R input of the third flip-flop 72 is coupled to the output of the third pulse generator 68.

The output of the first flip-flop 70 is a pulse train $P_4$, and is coupled to a digital indicator 76 which indicates the phase difference between the leading and trailing edges of the output pulses. The indicator 76 displays the phase difference, through the meter 28, in degrees as a function of the duty cycle of the output $P_4$. For example, if the duty cycle of the output $P_4$ is 50 percent, the meter 28 would register 180°. The outputs $P_5$ and $P_6$ from the second and third flip-flops 71,72 are also pulse trains, and are combined in a null-indicating meter 78, which indicates a null point when the pulses from the two flip-flops 71 and 72 have the same length. The meter 78 gives a non-zero reading when the pulses of $P_5$ and $P_6$ have different lengths.

Figure 6:
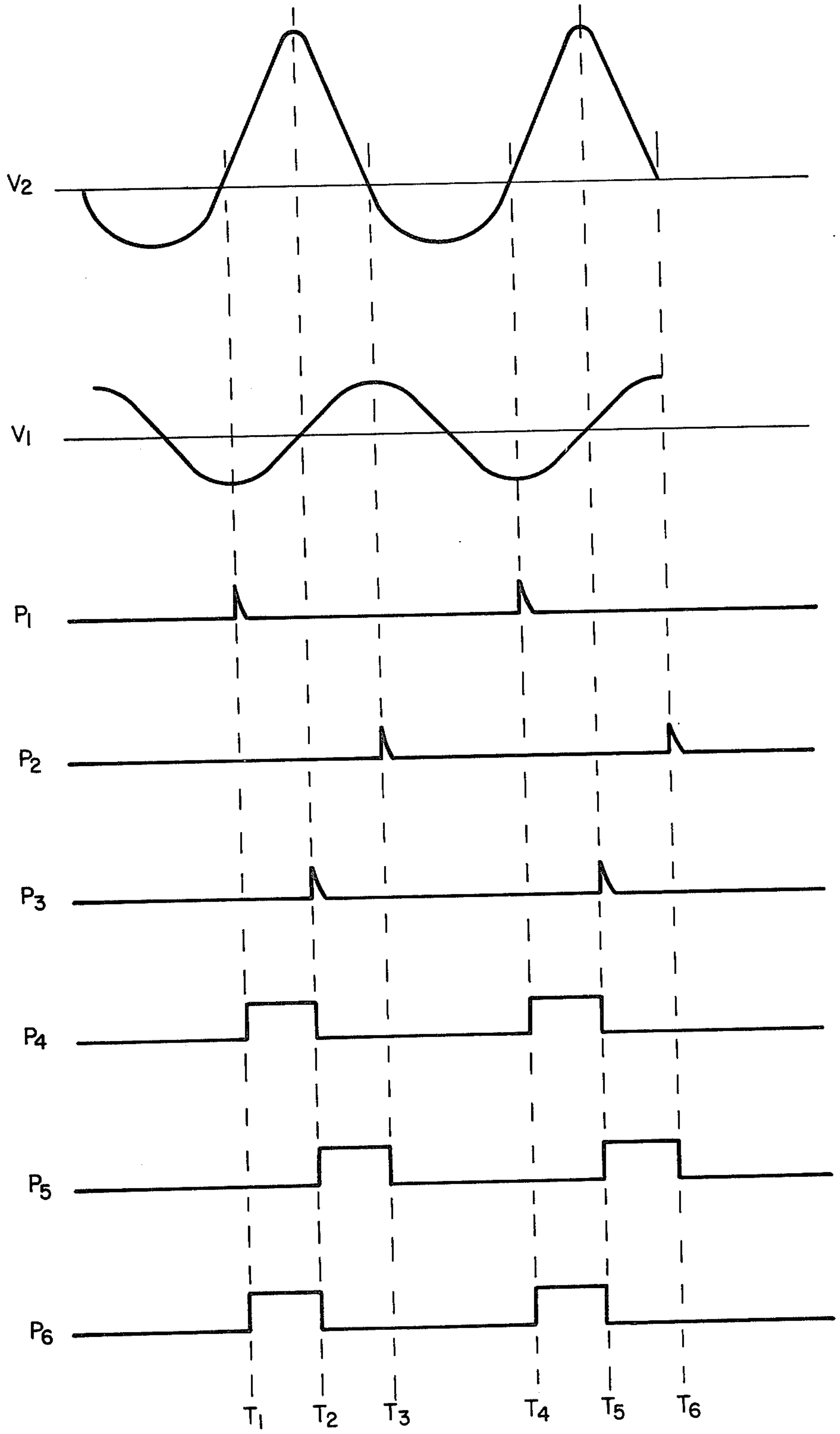
FIG. 6 is several of the voltage waveforms associated with the circuit of FIG. 5.

Referring to FIG. 6, several of the voltage waveforms occuring during the operation of the relative phase indicator 22 are shown. The horizontal line in each case represents the reference voltage, which is preferably ground. Due to the larger upper lobes, the DC voltage level of the shaped driving signal $V_2$ is higher than the ground reference voltage. Conventional phase meters detect zero crossings of the waveforms past a selected voltage level. This operation is satisfactory where the two waveforms being compared have the same shape, but not when the waveforms are different. The problem is especially acute when multi-cylinder compressors are being modeled, because the driving signals for each cylinder may have to be shaped differently, and any given selected voltage level may intersect each waveform at a different part of its cycle. A conventional phasemeter will read the point where each signal crosses the selected voltage level as the same point in the cycle, which is not the case.

Since zero crossings of the shaped driving signal $V_2$ cannot be used directly for phase measurements, the phase measurement portion 22 calculates the phase of the driving signal $V_2$ by assuming that the peak of the positive lobe occurs halfway between the positive and negative going transitions across any selected voltage level. The apparatus 22 initially sets the phase difference between the reference signal $V_1$ and the driving signal $V_2$ by adjusting the phase of the driving signal $V_2$ so that the upper lobe is centered over a positive going zero crossing of the reference signal $V_1$. This event occurs when the two signals are 90° out of phase, and the meter 58 can be calibrated to read 90° once this situation has been set up.

The improved phase detector portion 22 operates generally by inferring the peaks of the shaped signal $V_2$. By tracking the inferred peaks, the phase indicator determines the phase relationship between the sinusoidal signal $V_1$ and the shaped signal $V_2$.

As discussed above and shown better in FIG. 6, the output pulses $P_1$ from the first generator 64 occur at each positive going transition past the zero reference of the driving signal $V_2$. The output pulses $P_2$ from the second generator 66 occur at each negative going transition of $V_2$, and the output pulses $P_3$ from the third generator 68 occur at each positive going transition of the reference signal $V_1$. The output pulses $P_4$ from the first flip-flop 70 reflect the phase difference between the positive going transitions of the driving signal $V_2$ and the reference signal $V_1$. The output from the first flip-flop 70 goes positive at time $T_1$, and returns to zero at time $T_2$, when the flip-flop 70 is reset by he output of the third pulse generator 68. This repeats at time $T_4$ and $T_5$. The output of the third flip-flop 72 is also high between times $T_1$ and $T_2$ and times $T_4$ and $T_5$.

It will be appreciated by those skilled in the art that the output pulses $P_6$ from flip-flop 72 would have the same length when the diving signal $V_2$ leads the reference signal $V_1$ by 270° or 90°. To eliminate this ambiguity, the logic circuit 74 provides for triggering the S input of flip-flop 72 only when the output of the second comparator 59 is low. This may be accomplished, for example, by inverting the comparator 59 output, and logically ANDing the inverted comparator output with the first generator output $P_1$.

The output $P_5$ of the second flip-flop 71 goes high upon receipt of a pulse from the third generator 68, and resets upon the receipt of a pulse from the second generator 66. Thus, the time between $T_1$ and $T_3$ corresponds to that portion of the cycle that the driving signal $V_2$ is positive. $T_2$ corresponds to the time that the reference signal $V_1$ crosses the reference voltage.

With the switch 60 in position one, the phase of the shaped driving signal $V_2$ is controlled by adjusting the phase shifter 18 of FIG. 1. This phase is adjusted until the null meter 78 reads zero, which indicates that the outputs of the second and third flip-flops 71 and 72 have the same duration. This corresponds to that point in time $T_2$ where the reference signal $V_1$ crosses zero at the same point that the driving signal $V_2$ reaches the peak of its positive excursion, this peak corresponding to the top-dead-center position of the mechanical piston. This occurs when the driving signal $V_2$ and the reference signal $V_1$ are 90° out of phase.

The switch 60 is then moved to position 2. The voltage into the second input of the first voltage comparator 58 is varied by adjusting calibration circuit 62. The effect of adjusting the circuit 62 is to raise or lower the DC reference level shown in FIG. 6, which varies the width of the pulses in waveforms $P_4$, $P_5$ and $P_6$. Calibration circuit 62 is adjusted until pulse train $P_4$ has a duty cycle of 25%, which indicator 76 causes meter 28 to read as 90°. Thereafter, adjustment of the phase of $V_2$ by phase shifter 18 causes meter 28 to indicate the true phase difference between waveforms $V_1$ and $V_2$.

Use of the performance indicator 23 is discussed generally with respect to FIG. 2. The analog cylinder 10 is initially operated while pumping into a large volume, which is represented by a large capacitance (not shown) coupled to the cathode of the discharge diode 16 and to ground. The flowmeter 26 is coupled between the discharge diode 16 and Vd, and calibrated to read 100% as explained above.

To calibrate the relative horsepower portion 24, the phase indicator 22 is set for a 90° phase difference between the shifted driving signal $V_7$ and the shifted signal $V_4$. Ganged switch 55 is moved to position 2 so that signal $V_4$ is coupled to the second buffer 57, and $V_7$ is coupled to the first buffer 56. The horsepower 90° phase shifter 40 is adjusted until the null meter 78 reads 0, indicating that phase shifter 40 is shifting $V_4$ through exactly 90° with respect to $V_7$. The meter 28 is then switched to display the output from the horsepower indicator 24, which is then calibrated to read 100% as discussed above.

Switch 55 is then moved back to measure the relative phases of $V_1$ and $V_2$, and the phase shifter 18 is adjusted until the desired phase relationship between the reference and shaped signals $V_1$ and $V_2$ is obtained. The analog cylinder 10 is now coupled into the complete system model, and the relative horsepower 24 and capacity 26 portions of the device will register percentage changes from ideal operating conditions.

Although a preferred embodiment has been described in detail, it should be understood that various substitutions, alterations, and modifications may become apparent to those skilled in the art. These changes may be made without departing from the spirit and scope of the invention as defined by the appended claims.

What is claimed is:

1. A performance measuring device for use with an electrical analog of a reciprocating compressor, comprising:

a digital output device for presenting digital output data indicative of the performance of an electrical analog of a reciprocating compressor;

phase measurement means coupled to said digital output device for measuring the phase relationship between a non-sinusoidal driving signal and a sinusoidal reference voltage, said phase measurement means comprising:

means for generating first and second consecutive pulses, wherein the pulses exist while the driving signal voltage is higher than a first calibrating voltage, and wherein the first pulse ends and the second pulse begins when the reference signal crosses a second calibrating voltage on a positive transition;

means for adjusting the relative phase between the driving and reference signals;

means for determining when the first and second pulses have the same width;

means for generating a third pulse having a width proportional to the phase difference between the reference and driving signals;

means for indicating the width of the third pulse;

means for adjusting said indicating means to read 90° when the first and second pulses have equal width;

horsepower measurement means coupled to said digital output device for measuring changes in output horsepower of the electrical analog of a reciprocating compressor from a preselected ideal level; and current measuring means coupled to said digital output device for measuring the change in steady state current discharged from said electrical analog of a reciprocating compressor.

2. The performance measuring device according to claim 1 wherein said horsepower measurement means comprises:

means for obtaining a phase shifted driving signal;

product means for obtaining the product of a pressure signal and the phase shifted driving signal;

means for integrating the output from said product means; and means for indicating the integrated signal level.

3. The performance measuring device according to claim 1 wherein said current measuring means comprises:

a resistor placed in series with the steady state current flow;

a precision differential amplifier having an input coupled to each end of said resistor; and means coupled to the output of said amplifier for indicating the voltage output from said amplifier.

* * * * *